(12) United States Patent
He

(10) Patent No.: US 11,276,358 B2
(45) Date of Patent: Mar. 15, 2022

(54) DISPLAY PANEL AND METHOD OF MANUFACTURING THE SAME

(71) Applicant: HKC CORPORATION LIMITED, Guangdong (CN)

(72) Inventor: Huai Liang He, Chongqing (CN)

(73) Assignee: HKC CORPORATION LIMIIED, Shenzhen (CN)

( * ) Notice: Subject to any disclaimer, the term of this patent is extended or adjusted under 35 U.S.C. 154(b) by 0 days.

(21) Appl. No.: 16/640,953

(22) PCT Filed: Sep. 21, 2017

(86) PCT No.: PCT/CN2017/102588
§ 371 (c)(1),
(2) Date: Feb. 21, 2020

(87) PCT Pub. No.: WO2019/037185
PCT Pub. Date: Feb. 28, 2019

(65) Prior Publication Data
US 2020/0175933 A1  Jun. 4, 2020

(30) Foreign Application Priority Data

Aug. 24, 2017 (CN) .......................... 201710738550.7

(51) Int. Cl.
*G09G 3/36* (2006.01)
(52) U.S. Cl.
CPC ......... *G09G 3/3607* (2013.01); *G09G 3/3655* (2013.01); *G09G 3/3677* (2013.01); *G09G 3/3688* (2013.01); *G09G 2310/027* (2013.01); *G09G 2310/0278* (2013.01)

(58) Field of Classification Search
None
See application file for complete search history.

(56) References Cited

U.S. PATENT DOCUMENTS

| 2010/0025679 | A1* | 2/2010 | Yamazaki | ......... H01L 29/66969 |
| | | | | 257/43 |
| 2011/0127531 | A1 | 6/2011 | Kim | |
| 2018/0102086 | A1* | 4/2018 | Katayama | ......... H01L 29/41733 |

FOREIGN PATENT DOCUMENTS

| CN | 101995713 A | 3/2011 |
| CN | 102446925 A | 5/2012 |
| CN | 103499907 A | 1/2014 |

(Continued)

*Primary Examiner* — Stephen T. Reed
(74) *Attorney, Agent, or Firm* — Muncy, Geissler, Olds & Lowe, P.C.

(57) ABSTRACT

A display panel and a method for manufacturing the display panel are provided. The display panel includes a plurality of sub-pixels disposed on a substrate of the display panel. Each of the sub-pixels includes a drive transistor including a gate dielectric layer; a storage capacitor including a capacitance dielectric layer; a first insulating layer disposed between a data line of the display panel and a scan line of the display panel; a second insulating layer disposed between the data line and a common line of the display panel. The gate dielectric layer, the first insulating layer, the capacitance dielectric layer, and the second insulating layer are insulating films with different thicknesses integrally formed through a halftone masking or grayscale masking process, and a thickness of the gate dielectric layer is smaller than a thickness of the first insulating layer.

11 Claims, 7 Drawing Sheets

(56) References Cited

FOREIGN PATENT DOCUMENTS

| CN | 104465516 A | 3/2015 |
|---|---|---|
| CN | 104681420 A | 6/2015 |
| CN | 104900502 A | 9/2015 |
| CN | 105094486 A | 11/2015 |
| CN | 106711087 A | 5/2017 |

\* cited by examiner

DISPLAY PANEL AND METHOD OF MANUFACTURING THE SAME

TECHNOLOGY FIELD

This disclosure relates to a technical field of a display, and more particularly to a display panel and a method of manufacturing the same.

DESCRIPTION OF RELATED ART

With the increase of the resolution and the scan frequency of the display panel, the overall load thereof is also constantly increasing, thus resulting in the increase of the power consumption of the display panel and the reduction of lifetime. The overall load of the display panel relates to its parasitic capacitance, which includes the capacitance generated between a data line and a scan line of the display panel. By increasing a thickness of an insulating layer between the data line and the scan line, the parasitic capacitance can be reduced. However, in order to save the processes of the display panel, the gate dielectric layer in the drive transistor of the display panel is integrally formed with the insulating layer in a one-step process. The increase of the thickness of the insulation layer also leads to the increase of the thickness of the gate dielectric layer, so that the performance of the drive transistor is reduced, resulting in the decrease in the performance of the display panel.

SUMMARY

A main objective of this disclosure is to provide a display panel to solve the problem that the increase of the thickness of the above-mentioned insulating layer results in the increase of the thickness of the gate dielectric layer, and to improve the performance of the display panel.

An objective of this disclosure is achieved by providing a display panel, comprising a plurality of sub-pixels disposed on a substrate of the display panel. Each of the sub-pixels comprises a drive transistor, a storage capacitor, a first insulating layer, and a second insulating layer. The drive transistor comprises a gate dielectric layer. The storage capacitor comprises a capacitance dielectric layer. The first insulating layer is disposed between a data line of the display panel and a scan line of the display panel. The second insulating layer is disposed between the data line and a common line of the display panel. The gate dielectric layer, the first insulating layer, the capacitance dielectric layer, and the second insulating layer are insulating films with different thicknesses integrally formed through a halftone masking or grayscale masking process, and a thickness of the gate dielectric layer is smaller than a thickness of the first insulating layer.

Optionally, a thickness of the capacitance dielectric layer is smaller than a thickness of the second insulating layer.

Optionally, a thickness of the first insulating layer is equal to the thickness of the second insulating layer.

Optionally, each of the sub-pixels further comprises a passivation film, which covers the drive transistor, the data line, the scan line, and the common line, wherein the passivation film comprises a through hole, a sub-pixel electrode is disposed on the passivation film, and the sub-pixel electrode is electrically connected to a drain electrode of the drive transistor through the through hole.

Optionally, a material of the insulating film comprises one or plural ones of silicon oxide, silicon nitride, aluminum oxide and hafnium oxide.

Optionally, the plurality of sub-pixels are arranged in a rectangular array, one or plural ones of the sub-pixels form a pixel, the sub-pixels in the same pixel are arranged longitudinally; the plurality of data lines extend longitudinally and are arranged transversally; the plurality of scan lines extend transversally and are arranged longitudinally; and the sub-pixels in the same pixel are connected to the same one of the data lines, and are respectively connected to different ones of the scan lines.

This disclosure further provides a method for manufacturing the display panel. The display panel comprises a plurality of sub-pixels disposed on the substrate of the display panel. Each of the sub-pixels comprises a drive transistor, a storage capacitor, a first insulating layer, and a second insulating layer. The drive transistor comprises a gate dielectric layer. The storage capacitor comprises a capacitance dielectric layer. The first insulating layer is disposed between the data line of the display panel and the scan line of the display panel. The second insulating layer is disposed between the data line and the common line of the display panel. The gate dielectric layer, the first insulating layer, the capacitance dielectric layer, and the second insulating layer are insulating films with different thicknesses integrally formed through a halftone masking or grayscale masking process, and the thickness of the gate dielectric layer is smaller than the thickness of the first insulating layer. The method comprises the following steps: a first electroconductive pattern is deposited on a substrate of the display panel, wherein the first electroconductive pattern comprises a gate electrode and a scan line; an insulating film pattern is deposited on the first electroconductive pattern through a halftone masking or a grayscale masking process, wherein the insulating film pattern comprises a gate dielectric layer and a first insulating layer, and the thickness of the gate dielectric layer is smaller than the thickness of the first insulating layer; and a second electroconductive pattern is deposited on the insulating film pattern, wherein the second electroconductive pattern comprises a trench, a source electrode, a drain electrode, and a data line.

Optionally, the first electroconductive pattern further comprises a second electrode and a common line; the insulating film pattern further comprises a capacitance dielectric layer and a second insulating layer, and a thickness of the capacitance dielectric layer is smaller than a thickness of the second insulating layer; a pattern of the passivation film is deposited on the second electroconductive pattern, wherein the passivation film comprises a through hole; and a third electroconductive pattern is deposited on the pattern of the passivation film, wherein the third electroconductive pattern comprises a first electrode and a sub-pixel electrode, and the sub-pixel electrode is electrically connected to the drain electrode through the through hole.

Optionally, the step of the insulating film pattern deposited on the first electroconductive pattern through the halftone masking or the grayscale masking process comprises: an insulating film is deposited on the first electroconductive pattern; a photoresist is deposited on the insulating film; the photoresist is exposed through a halftone mask plate or a grayscale mask plate; the photoresist is developed to form a photoresist pattern corresponding to the insulating film pattern on the photoresist, wherein a thickness of a portion of the photoresist pattern corresponding to the gate dielectric layer is smaller than a thickness of a portion of the photoresist pattern corresponding to the first insulating layer; and the photoresist and the insulating film are etched to form the insulating film pattern.

Optionally, the step of the photoresist and the insulating film etched to form the insulating film pattern comprises: a photoresist ashing is performed to clear the part of the photoresist where the current thickness is minimum in the photoresist pattern; the insulating film is dry etched; and returning to the step that the photoresist ashing is performed to clear the part of the photoresist where the current thickness is minimum in the photoresist pattern.

In the technical aspects of this disclosure, the display panel comprises a plurality of sub-pixels disposed on a substrate of the display panel. Each of the sub-pixels comprises the drive transistor, the data line, the scan line, the sub-pixel electrode, the common line, the storage capacitor, the first insulating layer, and the second insulating layer. The drive transistor comprises a trench, a source electrode, a drain electrode, a gate dielectric layer, and a gate electrode. The source electrode and the drain electrode are respectively connected to two ends of the trench, and the gate dielectric layer is disposed among the trench, the source electrode, the drain electrode and the gate electrode, so that the gate electrode is insulated from the trench, the source electrode, and the drain electrode, respectively. The data line is electrically connected to the source electrode. The scan line is electrically connected to the gate electrode. The sub-pixel electrode is electrically connected to the drain electrode. The extending directions of the common line and the scan line are the same, and the common line is insulated from the scan line. The storage capacitor comprises a first electrode, a second electrode, and a capacitance dielectric layer, wherein the first electrode is electrically connected to the sub-pixel electrode, the second electrode is electrically connected to the common line, and the capacitance dielectric layer is disposed between the first electrode and the second electrode, so that the first electrode is insulated from the second electrode. The first insulating layer is disposed between the data line and the scan line, so that the data line is insulated from the scan line. The second insulating layer is disposed between the data line and the common line, so that the data line is insulated from the common line. The gate dielectric layer, the first insulating layer, the capacitance dielectric layer and the second insulating layer are insulating films integrally formed through a halftone masking or grayscale masking process, and a thickness of the gate dielectric layer is smaller than a thickness of the first insulating layer. The gate electrode level of the drive transistor is changed by the input level of the scan line, thereby controlling a trench to turn on and turn off. When the trench is turned on, the display grayscale of the sub-pixel is controlled by the input level of the data line to achieve the image displaying. The structures of the gate capacitor of the drive transistor and the parasitic capacitor formed between the data line and the scan line are similar to that of the parallel-plate capacitor. In the parallel-plate capacitor, the capacitance decreases as the distance between two parallel-plates increases. Thus, with the thinning of the gate dielectric layer, the gate capacitance increases and the gate electrode has a better control effect on the drive transistor. However, with the thickening of the first insulating layer, the parasitic capacitance generated between the data line and the scan line is decreased, thereby reducing the overall load of the display panel. The gate dielectric layer and the first insulating layer are integrally formed with the insulating film through a halftone masking or grayscale masking process. In the halftone masking or grayscale masking process, a mask pattern corresponding to an insulating film pattern is formed on the halftone mask plate or the grayscale mask plate, and the transmittances of the different parts of the halftone mask plate or the grayscale mask plate are different, so that the insulating film patterns with different thicknesses are formed. In this disclosure, the gate dielectric layer and the first insulating layer having different thicknesses are integrally formed through the halftone masking or grayscale masking process. First, the increase of the process complexity resulting from the plurality of depositions of insulating films is avoided, the manufacturing cost is reduced, and the possible interface defects are avoided. Second, the thickness of the gate dielectric layer may be flexibly adjusted according to the performance requirements of the drive transistor, the performance of the drive transistor is not affected, and specifically, the on-state current of the drive transistor is not affected, wherein by further optimizing the thickness of the gate dielectric layer, the response speed of the display panel may also be further improved, and the resolution of the data line level corresponding to the image grayscale is increased, thereby increasing the resolution of the display panel. Third, the thickness of the first insulating layer may be flexibly adjusted according to the requirement of the parasitic capacitance between the data line and the scan line, wherein by increasing the thickness of the first insulating layer, the parasitic capacitance between the data line and the scan line can be reduced, and the overall load of the display panel is reduced, thereby improving the performance of the display panel.

BRIEF DESCRIPTION OF THE DRAWINGS

The disclosure will become more fully understood from the detailed description and accompanying drawings, which are given for illustration only, and thus are not limitative of the present disclosure, and wherein.

Figure 1:
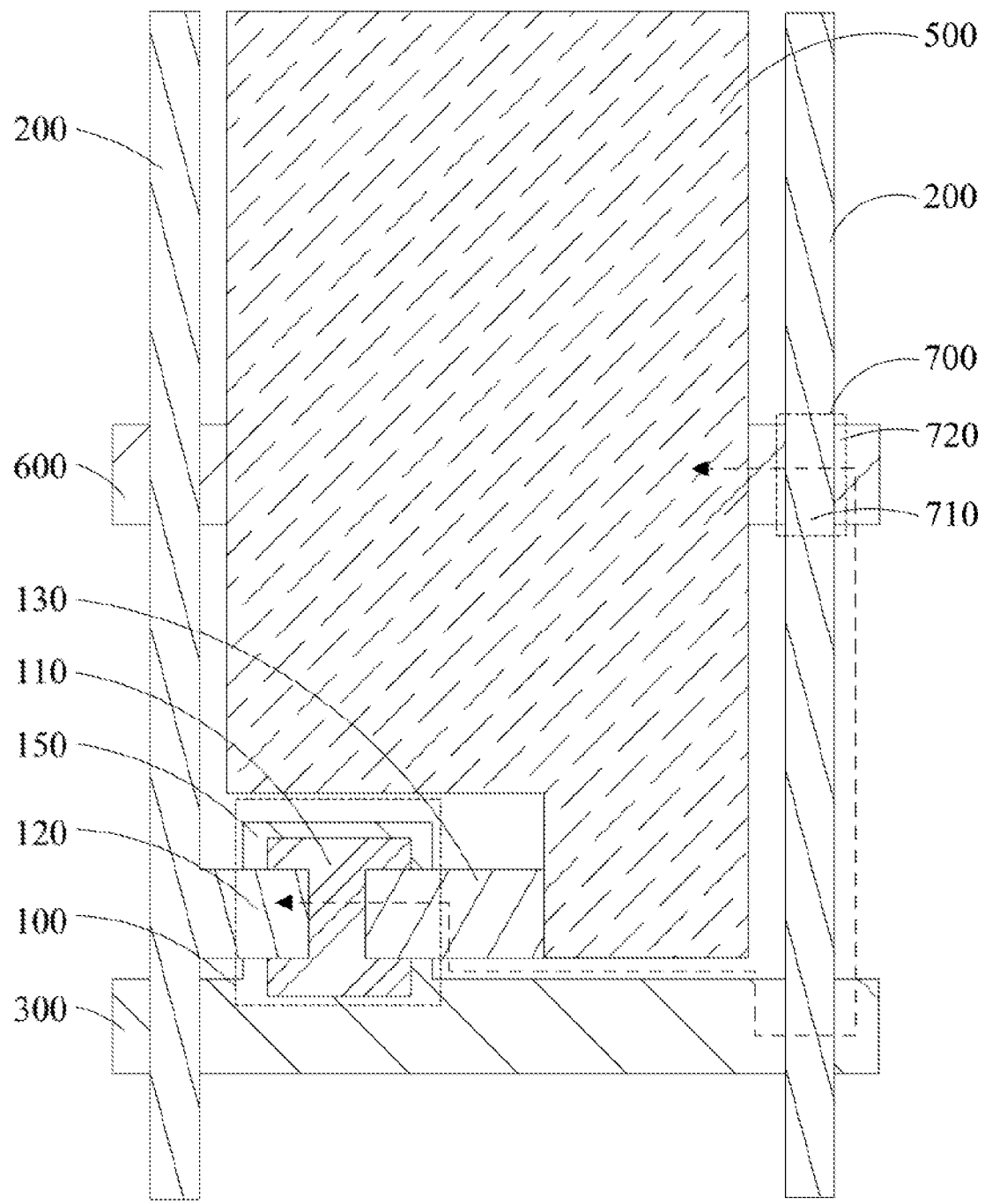
FIG. 1 is a schematic structure view showing a sub-pixel in an embodiment of the display panel of this disclosure.

The implementation, functional characteristics and advantages of this disclosure will be further described with reference to the accompanying drawings.

DETAILED DESCRIPTION OF THE DISCLOSURE

In conjunction with the following drawings of the present application example embodiments, the technical solutions in the present application will be clearly and completely described, obviously, the described embodiments are merely part of embodiments of the present application, rather than all embodiments. Based on the embodiments of the present application, all other embodiments of ordinary skill in the art without creative efforts shall be made available, should belong to the scope of the present application.

In the description of this disclosure, it is to be understood that the terms "center", "transversal", "up", "down", "left", "right", "vertical", "horizontal", "top", "bottom", "inside" and "outside" indicating the orientation or position relationships are the orientation or position relationships based on the drawing, are only provided for the purposes of describing this disclosure and simplifying the description, but do not indicate or imply that the directed devices or elements must have the specific orientations or be constructed and operated in the specific orientations, and thus cannot be understood as the restriction to this disclosure. The specification and claims of this disclosure, and the terms "comprising" in the above-mentioned drawings and any variations thereof intend to cover the non-exclusive inclusion. For example, a process, method, system, product or device comprising a series of steps or units is not limited to the listed steps or units, but may further optionally comprise steps or units not listed, or alternatively comprise other steps or units inherent to these processes, methods, products or equipment.

In addition, the terms "first," "second" and "third" are used to distinguish between different objects and not for describing a particular order. In addition, the terms "first", and "second" are used for the illustrative purpose only and cannot be understood as indicating or implying the relative importance or implicitly specifying the number of indicated technical features. Therefore, the features restricted by "first" and "second" may expressly or implicitly comprise one or plural ones of the features. In the description of this disclosure, unless otherwise described, the meaning of "a plurality of" comprises two or more than two. In addition, the terms "comprises" and any modification thereof intend to cover the non-exclusive inclusions.

This disclosure provides a display panel.

Figure 2:
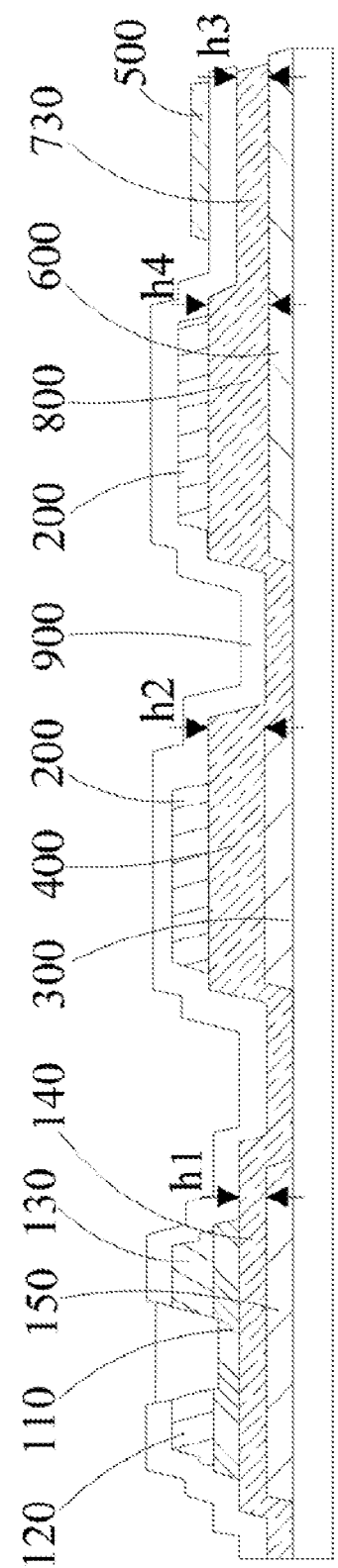
FIG. 2 is a schematic structural side view showing a sub-pixel along a dashed-line arrow direction in FIG. 1.

In an embodiment of this disclosure, as shown in FIGS. 1 and 2, a display panel includes a plurality of sub-pixels disposed on a substrate of the display panel, and the sub-pixel includes a drive transistor 100, a data line 200, a scan line 300, a sub-pixel electrode 500, a common line 600, a storage capacitor 700, a first insulating layer 400 and a second insulating layer 800. The drive transistor 100 includes a trench 110, a source electrode 120, a drain electrode 130, a gate dielectric layer 140 and a gate electrode 150. The source electrode 120 and the drain electrode 130 are respectively connected to two ends of the trench 110. The gate dielectric layer 140 is disposed among the trench 110, the source electrode 120, the drain electrode 130 and the gate electrode 150, so that the gate electrode 150 is insulated from the trench 110, the source electrode 120 and the drain electrode 130, respectively. The data line 200 is electrically connected to the source electrode 120; the scan line 300 is electrically connected to the gate electrode 150; and the sub-pixel electrode 500 is electrically connected to the drain electrode 130. The extending directions of the common line 600 and the scan line 300 are the same, and the common line 600 is insulated from the scan line 300. The storage capacitor 700 includes a first electrode 710, a second electrode 720 and a capacitance dielectric layer 730. The first electrode 710 is electrically connected to the sub-pixel electrode 500, the second electrode 720 is electrically connected to the common line 600, and the capacitance dielectric layer 730 is disposed between the first electrode 710 and the second electrode 720, so that the first electrode 710 is insulated from the second electrode 720; the second insulating layer 800 is disposed between the data line 200 and the common line 600, so that the data line 200 is insulated from the common line 600; the first insulating layer 400 is disposed between the data line 200 and the scan line 300, so that the data line 200 is insulated from the scan line 300; and the gate dielectric layer 140, the first insulating layer 400, the capacitance dielectric layer 730 and the second insulating layer 800 are integrally formed with the insulating films through the halftone masking or grayscale masking process, and the thickness of the gate dielectric layer 140 is smaller than the thickness of the first insulating layer 400.

Specifically, the drive transistor 100 is used to control the display grayscale of the sub-pixel, wherein the scan line 300 is used to control the drive transistor 100 to turn on and turn off, and the level of the data line 200 corresponds to the image information. The gate electrode level electrically connected to the scan line 300 is changed under the control of the input level of the data line 200. When the gate electrode level controls the trench 110 of the drive transistor to turn on, the data line 200 connected to the source electrode 120 inputs the image information to the drive transistor 100 to control the display grayscale of the sub-pixel, and thus achieve the image displaying. The source electrode 120 and the drain electrode 130 of the drive transistor may include more than one layer of electroconductive material, wherein the work function of the lower electroconductive material in direct contact with the trench 110 matches with the work function of the trench material in order to reduce the contact resistance and to improve the performance of the drive transistor 100. However, the electroconductive metal material may be selected for the upper electroconductive material to have the higher conductivity. The performance of the drive transistor 100 relates to the thickness of the gate dielectric layer 140, wherein as the thickness gets thinner, the gate capacitance gets larger, the gate control ability gets better, and the on-state current of the drive transistor 100 gets higher, thereby making the sub-pixel have the faster response speed and the better grayscale resolution, diminishing the delay and distortion phenomena in the display process, and improving the performance.

Because the data line 200 and the scan line 300 cross each other in the spatial distribution, in order to prevent the data line 200 and the scan line 300 from being turned on, the first insulating layer 400 is provided between the data line 200 and the scan line 300, the first insulating layer 400 is at least distributed at the intersection of the data line 200 and the scan line 300. Of course, the distribution range of the first insulating layer 400 may be larger than the cross range of the data line 200 and the scan line 300. In a portion where the data line 200, the first insulating layer 400 and the scan line 300 are stacked, a structure similar to the parallel-plate capacitor is formed. With the increase of the thickness of the first insulating layer 400, the capacitance values formed by the data line 200, the first insulating layer 400 and the scan line 300 are decreased, thereby reducing the parasitic capacitance of the sub-pixel, improving the response speed of the sub-pixel and reducing the overall load.

The gate dielectric layer 140 and the first insulating layer 400 are integrally formed with the insulating film through the halftone masking or grayscale masking process. In the halftone masking or grayscale masking process, a mask pattern corresponding to an insulating film pattern is formed on the halftone mask plate or the grayscale mask. In the halftone mask plate, the portions having different light transmittances are formed according to different patterns. In the grayscale mask, varying transmittances are formed according to the pattern at different positions, thereby forming the photoresist patterns with different thicknesses in the lithographing process, and then forming the insulating film patterns with different thicknesses through processes such as etching and the like. In this disclosure, the gate dielectric layer 140 and the first insulating layer 400 having different thicknesses are integrally formed through the halftone masking or grayscale masking process, so as to prevent the insulating film from being deposited a plurality of times for the purpose of forming the gate dielectric layer 140 and the first insulating layer 400 having different thicknesses, and thus to avoid the defects, which are on the insulating film interface between adjacent layers and may be caused during the plurality of depositing processes. Such defects may lead to the introduction of interface charges on the interface and affect the display performance of the sub-pixel. In addition, the thickness h1 of the gate dielectric layer 140 is smaller than the thickness h2 of the first insulating layer 400. On the one hand, the gate control requirement of the drive transistor 100 is satisfied; and on the other hand, the parasitic capacitance between the data line 200 and the scan line 300 is reduced, so that the overall load of the display panel is reduced and the performance of the display panel is thereby improved.

In the technical solution of this disclosure, the display panel includes a plurality of sub-pixels disposed on the substrate of the display panel. The sub-pixel includes the drive transistor 100, the data line 200, the scan line 300, the sub-pixel electrode 500, the common line 600, the storage capacitor 700, the first insulating layer 400 and the second insulating layer 800. The drive transistor 100 includes the trench 110, the source electrode 120, the drain electrode 130, the gate dielectric layer 140 and the gate electrode 150. The source electrode 120 and the drain electrode 130 are respectively connected to two ends of the trench 110. The gate dielectric layer 140 is disposed among the trench 110, the source electrode 120, the drain electrode 130 and the gate electrode 150, so that the gate electrode 150 is insulated from the trench 110, the source electrode 120 and the drain electrode 130, respectively. The data line 200 is electrically connected to the source electrode 120. The scan line 300 is electrically connected to the gate electrode 150. The sub-pixel electrode 500 is electrically connected to the drain electrode 130. The extending directions of the common line 600 and the scan line 300 are the same, and the common line 600 is insulated from the scan line 300. The storage capacitor 700 includes the first electrode 710, the second electrode 720 and the capacitance dielectric layer 730. The first electrode 710 is electrically connected to the sub-pixel electrode 500, the second electrode 720 is electrically connected to the common line 600, and the capacitance dielectric layer 730 is disposed between the first electrode 710 and the second electrode 720, so that the first electrode 710 is insulated from the second electrode 720. The second insulating layer 800 is disposed between the data line 200 and the common line 600, so that the data line 200 is insulated from the common line 600. The first insulating layer 400 is disposed between the data line 200 and the scan line 300, so that the data line 200 is insulated from the scan line 300. The gate electrode level of the drive transistor 100 is changed by the input level of the scan line 300, thereby controlling the trench 110 to turn on and turn off. When the trench 110 is turned on, the display grayscale of the sub-pixel is controlled by the input level of the data line 200 to achieve the image displaying. The structures of the gate capacitor of the drive transistor 100 and the parasitic capacitor formed between the data line 200 and the scan line 300 are similar to that of the parallel-plate capacitor. In the parallel-plate capacitor, the capacitance decreases as the distance between two parallel-plates increases. Thus, with the thinning of the gate dielectric layer 140, the gate capacitance increases and the gate electrode 150 has a better control effect on the drive transistor 100. However, with the thickening of the first insulating layer 400, the parasitic capacitance generated between the data line 200 and the scan line 300 is decreased, thereby reducing the overall load of the display panel. The gate dielectric layer 140, the first insulating layer 400, the capacitance dielectric layer 730 and the second insulating layer 800 are integrally formed with the insulating films through the halftone masking or grayscale masking process. In the halftone masking or grayscale masking process, a mask pattern corresponding to an insulating film pattern is formed on the halftone mask plate or grayscale mask plate, and the insulating film patterns with different thicknesses are thus formed. In this disclosure, the gate dielectric layer 140 and the first insulating layer 400 having different thicknesses are integrally formed through the halftone masking or grayscale masking process. First, the increase of the process complexity resulting from the plurality of depositions of insulating films is avoided, the manufacturing cost is reduced, and possible interface defects are avoided. Second, the thickness of the gate dielectric layer 140 may be flexibly adjusted according to the performance requirements of the drive transistor 100, the performance of the drive transistor 100 is not affected, and specifically, the on-state current of the drive transistor 100 is not affected. By further optimizing the thickness of the gate dielectric layer 140, the response speed of the display panel may also be further improved, and the resolution of the data line level corresponding to the image grayscale is increased, thereby increasing the resolution of the display panel. Third, the thickness of the first insulating layer 400 may be flexibly adjusted according to the requirement of the parasitic capacitance between the data line 200 and the scan line 300. By increasing the thickness of the first insulating layer, the parasitic capacitance between the data line 200 and the scan line 300 can be reduced, the overall load of the display panel is reduced, and the performance of the display panel is thereby improved.

In an embodiment of this disclosure, as shown in FIGS. 1 and 2, the thickness of the capacitance dielectric layer 730 is smaller than the thickness of the second insulating layer 800.

The drive transistor 100 charges/discharges the sub-pixel electrode 500 through the drain electrode 130. Liquid crystals are filled between a first substrate of the display panel, where the sub-pixel electrode 500 is located, and a second substrate of the display panel. Under the action of an electric field between the sub-pixel electrode 500 and the common electrode of the second substrate, the arrangement directions of the liquid crystals deflects, thereby controlling the display grayscale of the sub-pixel, and generating the display image.

It is considered that the liquid crystals are filled between the sub-pixel electrode 500 and the common electrode, it is difficult to maintain the electric field of the liquid crystal capacitor, the storage capacitor 700 is also included in the sub-pixel, and the storage capacitor 700 is disposed in parallel with the liquid crystal capacitor to maintain the electric field and to maintain the deflections of the liquid crystals, so that the display image is stable. The storage capacitor may be formed between the electrode of the sub-pixel and the scan line that is not connected to the sub-pixel, and the common line may also be provided additionally, so that the storage capacitor is formed between the electrode of the sub-pixel and the common line. In this embodiment, the first electrode 710 of the storage capacitor 700 is electrically connected to the sub-pixel electrode 500, the second electrode 720 is electrically connected to the common line 600, the capacitance dielectric layer 730 is disposed between the first electrode 710 and the second electrode 720, and a structure similar to the parallel-plate capacitor is formed. With the thinning of the thickness of the capacitance dielectric layer 730, the capacitance of the storage capacitor 700 is increased, and the better performance is thereby possessed.

The common line 600 may be disposed in parallel with or approximately in parallel with the scan line 300. In order to prevent the common line 600 and the data line 200 from being turned on due to the crossing, the second insulating layer 800 is provided between the common line 600 and the data line 200, and the second insulating layer 800 is at least distributed at the intersection of the common line 600 and the data line 200. Of course, the distribution range of the second insulating layer 800 may be larger than the cross range of the common line 600 and the data line 200. In a portion where the common line 600, the second insulating layer 800 and the data line 200 are stacked, a structure similar to the parallel-plate capacitor is formed. With the increase of the thickness of the second insulating layer 800, the capacitance values formed by the common line 600, the second insulating layer 800 and the data line 200 are decreased, thereby reducing the parasitic capacitance of the sub-pixel, improving the response speed of the sub-pixel and reducing the overall load.

The gate dielectric layer 140, the first insulating layer 400, the capacitance dielectric layer 730 and the second insulating layer 800 are integrally formed with the insulating film through the halftone masking or grayscale masking process. In the halftone masking or grayscale masking process, a mask pattern corresponding to an insulating film pattern is formed on the halftone mask plate or the grayscale mask plate. In the halftone mask plate or the grayscale mask plate, the portions having different light transmittances are formed according to different patterns, or varying transmittances are formed at different positions, thereby forming the photoresist patterns with different thicknesses in the lithographing process, and then forming the insulating film patterns with different thicknesses through processes, such as etching and the like. The gate dielectric layer 140, the first insulating layer 400, the capacitance dielectric layer 730 and the second insulating layer 800 having different thicknesses are integrally formed through the halftone masking or grayscale masking process, so as to prevent the plurality of times of depositing from leading to the increase of the process steps, to avoid the increase of the manufacturing costs, to avoid the interface defects that may result from a plurality of depositing processes, and thus to avoid the influence of interface charges on the display performance of the sub-pixel. In addition, the thickness h3 of the capacitance dielectric layer 730 is smaller than the thickness h4 of the second insulating layer 800. On the one hand, the capacitance requirement of the storage capacitor 700 is satisfied; and on the other hand, the parasitic capacitance between the common line 600 and the data line 200 is reduced, so that the overall load of the display panel is reduced, and the performance of the display panel is thereby improved.

Optionally, the thickness h2 of the first insulating layer 400 is equal to the thickness h4 of the second insulating layer 800. Since the main functions of the first insulating layer 400 and the second insulating layer 800 are the insulation functions, and when their thicknesses are equal to each other, the plate making cost of the halftone mask plate or the grayscale mask plate in the process can be reduced, and the manufacturing cost is thus reduced. However, the thickness h1 of the gate dielectric layer 140 relates to the performance requirement of the drive transistor 100, and the thickness h3 of the capacitance dielectric layer relates to the capacitance requirement of the storage capacitor 700. Thus, the thicknesses h1 and h3 may be different from the thicknesses h2 and h4.

In this embodiment, as shown in FIG. 2, the sub-pixel also includes a passivation film 900, which covers the drive transistor 100, the data line 200, the scan line 300 and the common line 600 to prevent oxygen, water vapor and the like in the air from influencing the performance of the sub-pixel, more particularly the performance of the drive transistor 100 and each wire in the sub-pixel. The passivation film 900 includes a through hole, the sub-pixel electrode 500 is disposed on the passivation film 900, and the sub-pixel electrode 500 is electrically connected to the drain electrode 130 through the through hole. Through the layered arrangement, the aperture ratio of the sub-pixel is improved, thereby reducing the required backlight source power and reducing the power consumption of the display panel.

In this disclosure, a material of the insulating film comprises one or plural ones of silicon oxide, silicon nitride, aluminum oxide and hafnium oxide. The silicon oxide may be produced directly on the silicon trench material by processes such as thermal oxidation and the like, and has simple and reliable process. However, silicon nitride, aluminum oxide or hafnium oxide materials have higher dielectric constants than silicon oxide, thereby making the drive transistor and the storage capacitor have the better electrical performance. Of course, multi-layer insulating films including different materials may also be deposited. For example, silicon nitride, aluminum oxide or hafnium oxide with the higher dielectric constant is deposited on the bottom layer, and silicon oxide is deposited on the top layer. The gate dielectric layer and the capacitance dielectric layer, which include only silicon nitride, aluminum oxide or hafnium oxide, are formed through the halftone masking or grayscale masking process to improve the performance of the drive transistor and the storage capacitor. The first insulating layer and the second insulating layer, which include silicon nitride, aluminum oxide or hafnium oxide and silicon oxide, are formed at the same time to reduce the material cost of the insulating film, and to simultaneously improve the insulation performance of the first insulating layer and the second insulating layer.

The display panel has a variety of architectural aspects. Optionally, the plurality of sub-pixels are arranged in a rectangular array, one or plural ones of the sub-pixels form a pixel. Usually, one pixel includes three sub-pixels for controlling the display of three colors of red, green and blue, respectively. Of course, one pixel may also include four sub-pixels, and there are many kinds of arrangements between sub-pixels. Under the usual conditions, the data lines of the display panel extend longitudinally and are arranged transversally, and the scan lines of the display panel extend transversally and are arranged longitudinally.

Figure 3:
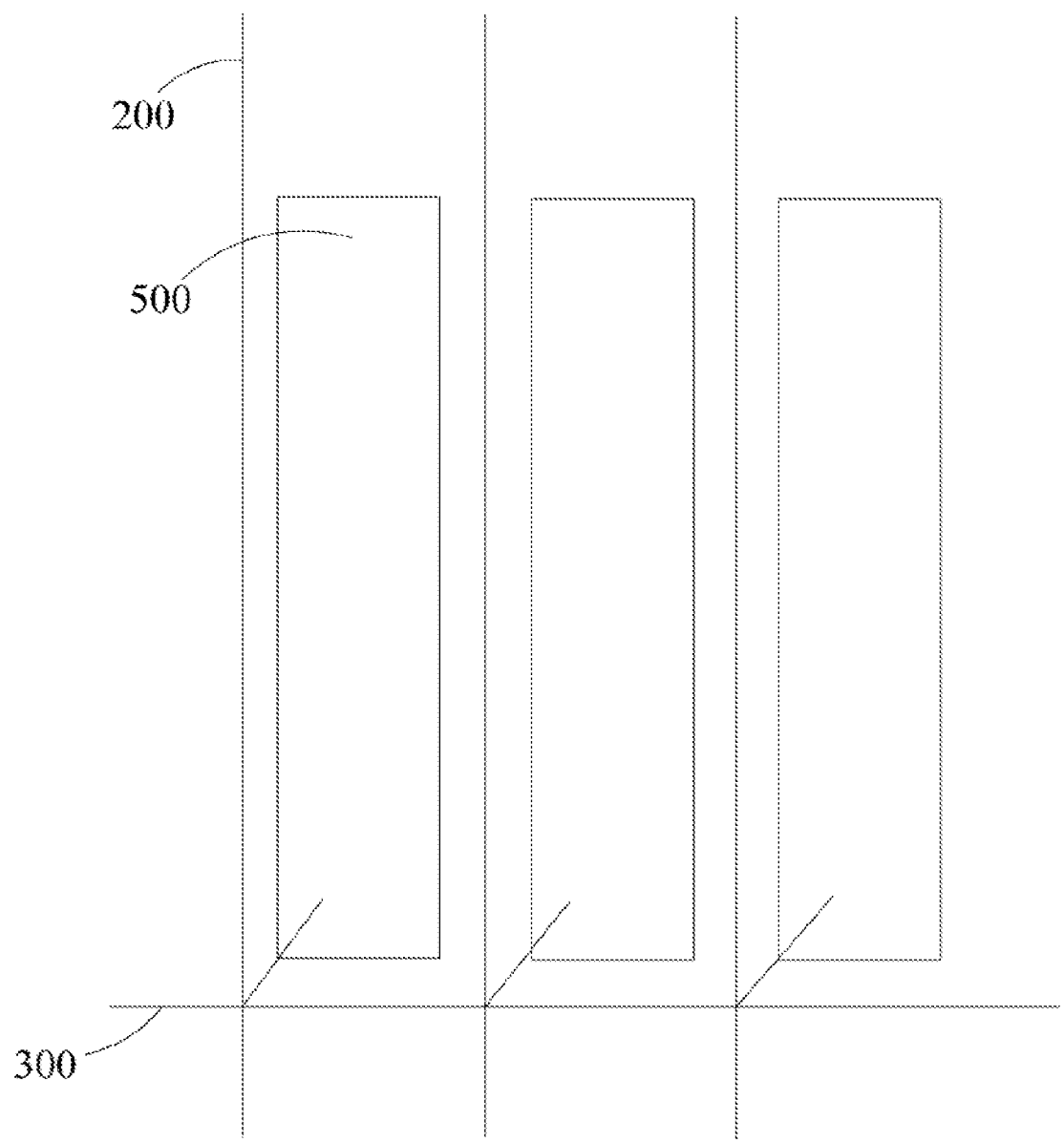
FIG. 3 is a schematic structure view showing an embodiment of the display panel of this disclosure.

In an embodiment of this disclosure, as shown in FIG. 3, it shows a display panel of the conventional architecture, wherein three sub-pixels of the same pixel are arranged transversally; a plurality of data lines 200 extend longitudinally and are arranged transversally; a plurality of scan lines 300 extend transversally and are arranged longitudinally; and the sub-pixels of the same pixel are connected to the same scan line 300, and respectively connected to different data lines 200.

Figure 4:
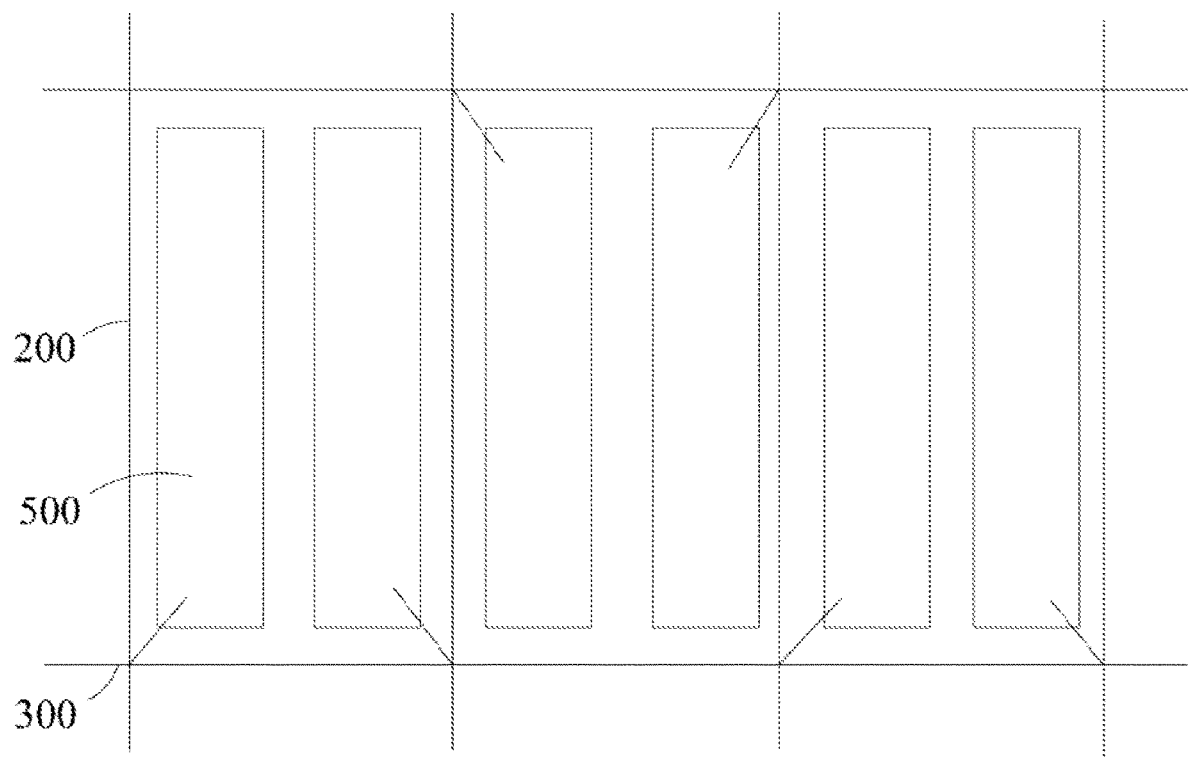
FIG. 4 is a schematic structure view showing another embodiment of the display panel of this disclosure.

In another embodiment of this disclosure, as shown in FIG. 4, it shows a display panel of the half source driving architecture. Two sub-pixels are taken as a group, two sub-pixels in a group are connected to the same scan line 300, and respectively connected to different data lines 200, sub-pixels in adjacent groups are respectively connected to different scan lines 300, and adjacent sub-pixels inside adjacent groups share a data line 200. Compared to the conventional architecture, the scan frequency in the half source driving architecture is twice that of the conventional architecture.

Figure 5:
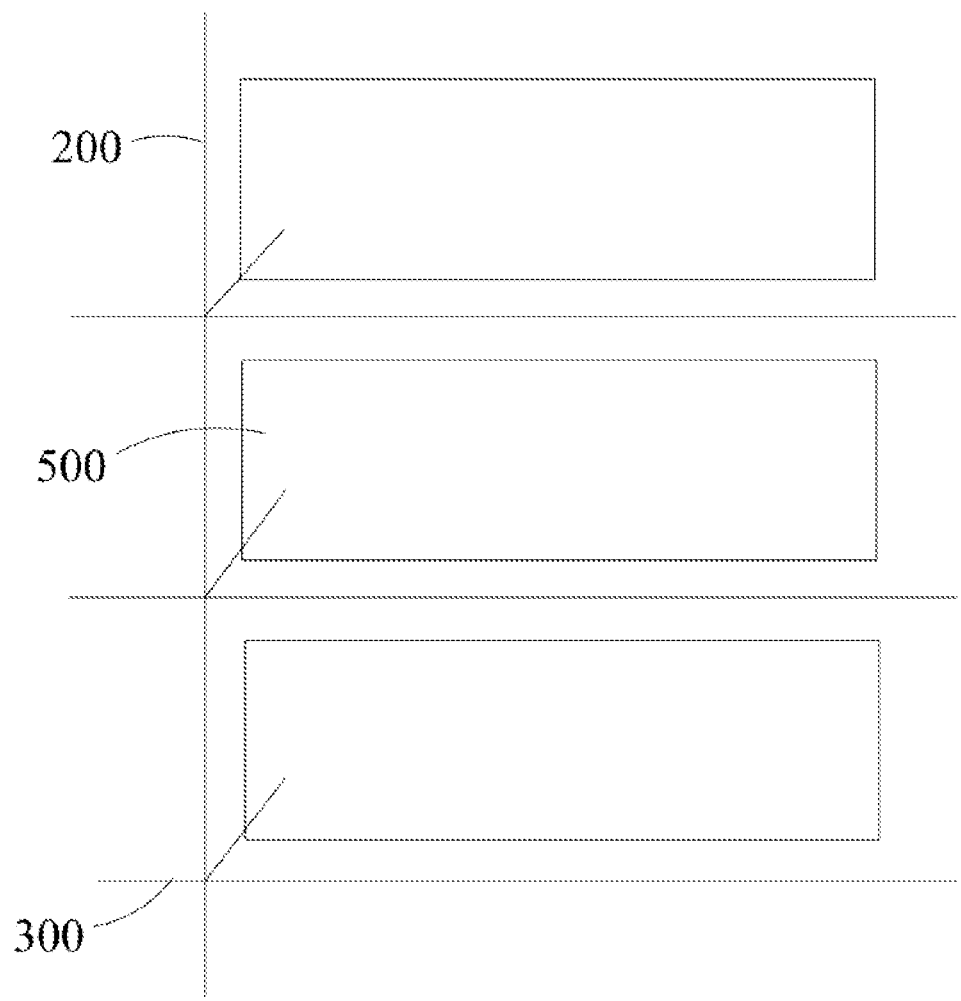
FIG. 5 is a schematic structure view showing still another embodiment of the display panel of this disclosure.

In still another embodiment of this disclosure, as shown in FIG. 5, it shows a display panel of the triple gate architecture, wherein three sub-pixels of the same pixel are arranged longitudinally; and the sub-pixels of the same pixel are connected to the same data line 200, and respectively connected to different scan lines 300. In this architecture, the number of the data lines 200 having the higher cost is reduced, and the manufacturing cost is reduced. In addition, compared with the display panel of the conventional architecture, the scan frequency is three times that of the conventional architecture. Correspondingly, the overall load of the display panel may be also increased significantly. Therefore, it is necessary to provide the insulating films having different thicknesses to satisfy the corresponding performance requirements.

Figure 6:
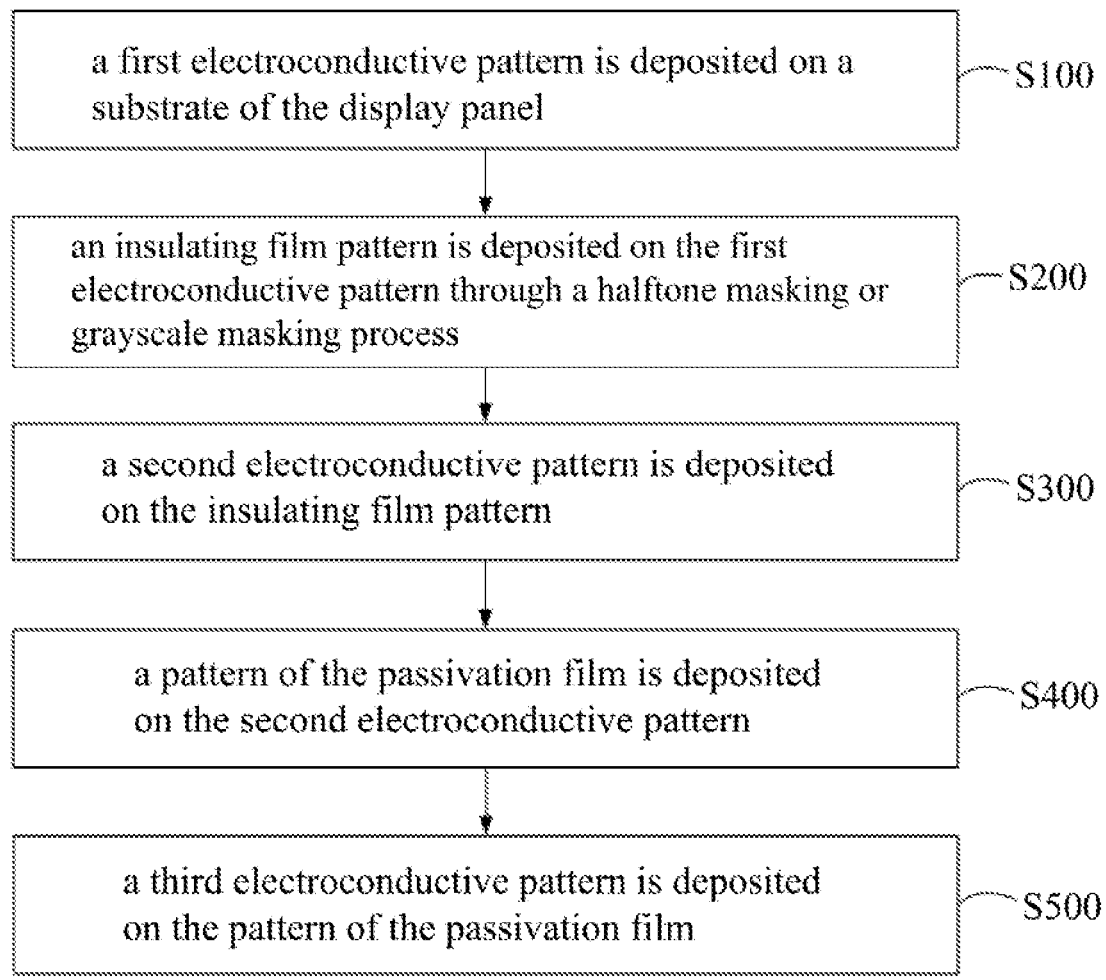
FIG. 6 is a schematic flow chart showing an embodiment of a manufacturing method of the display panel of this disclosure.

This disclosure also provides a method for manufacturing the above-mentioned display panel. As shown in FIG. 6, the method of manufacturing the display panel includes the following steps.

In a step S100, a first electroconductive pattern is deposited on a substrate of the display panel.

The first electroconductive pattern includes the gate electrode 150 and the scan line 300, and the gate electrode 150 is electrically connected to the scan line 300 to control the turning on and off of the drive transistor 100 by the level of the scan line 300.

In a step S200, an insulating film pattern is deposited on the first electroconductive pattern through a halftone masking or grayscale masking process.

The insulating film pattern includes the gate dielectric layer 140 and the first insulating layer 400, and the thickness of the gate dielectric layer 140 is smaller than the thickness of the first insulating layer 400. On the one hand, the gate control performance of the drive transistor 100 is ensured, the on-state current of the drive transistor 100 is increased, the corresponding speed is improved and the resolution of the display grayscale is improved; and on the other hand, the parasitic capacitance generated by the data line 200 and the scan line 300 is reduced, and the overall load of the display panel is reduced.

In a step S300, a second electroconductive pattern is deposited on the insulating film pattern.

The second electroconductive pattern includes the trench 110, the source electrode 120, the drain electrode 130 and the data line 200. Because there may be differences between the materials of the trench 110, the source electrode 120, the drain electrode 130 and the data line 200, the step S300 may include a plurality of processes to form the trench 110, the source electrode 120, the drain electrode 130 and the data line 200, respectively.

In each of the above-mentioned steps, in the deposition of each material layer pattern, the mask plate pattern corresponding to the corresponding material layer pattern is firstly transferred into a photoresist pattern by lithography, and then the photoresist pattern is transferred into the corresponding material layer pattern through processes such as the sacrificial layer etching process, the coating peeling process or the like.

Further, the first electroconductive pattern also includes the second electrode 720 and the common line 600; the second electrode 720 and the common line 600 are deposited at the same time in the step S100; the insulating film pattern also includes the capacitance dielectric layer 730 and the second insulating layer 800, and the thickness of the capacitance dielectric layer 730 is smaller than the thickness of the second insulating layer 800; and the capacitance dielectric layer 730 and the second insulating layer 800 are integrally formed through the halftone masking or grayscale masking process in the step S200 to reduce the process steps, and reduce the manufacturing cost.

As shown in FIG. 6, after the step S300, the manufacturing method of the display panel also includes the following steps.

In a step S400, a pattern of the passivation film 900 is deposited on the second electroconductive pattern.

The passivation film 900 includes the through hole, and the passivation film 900 is used to reduce the impact of oxygen, water vapor and the like in the air on the performance of the drive transistor 100 and each wire, thereby improving the stability of the display panel and extending the lifetime of the display panel.

In a step S500, a third electroconductive pattern is deposited on the pattern of the passivation film 900.

The third electroconductive pattern includes the first electrode 710 and the sub-pixel electrode 500, and the sub-pixel electrode 500 is electrically connected to the drain electrode 130 through the through hole. On the one hand, the sub-pixel electrode 500 is insulated from other parts of the sub-pixel; and on the other hand, the aperture ratio of the sub-pixel is increased, and the excessive area occupied by the circuit is avoided, thereby reducing the brightness of the backlight source needed, and thus reducing the power consumption of the display panel.

Figure 7:
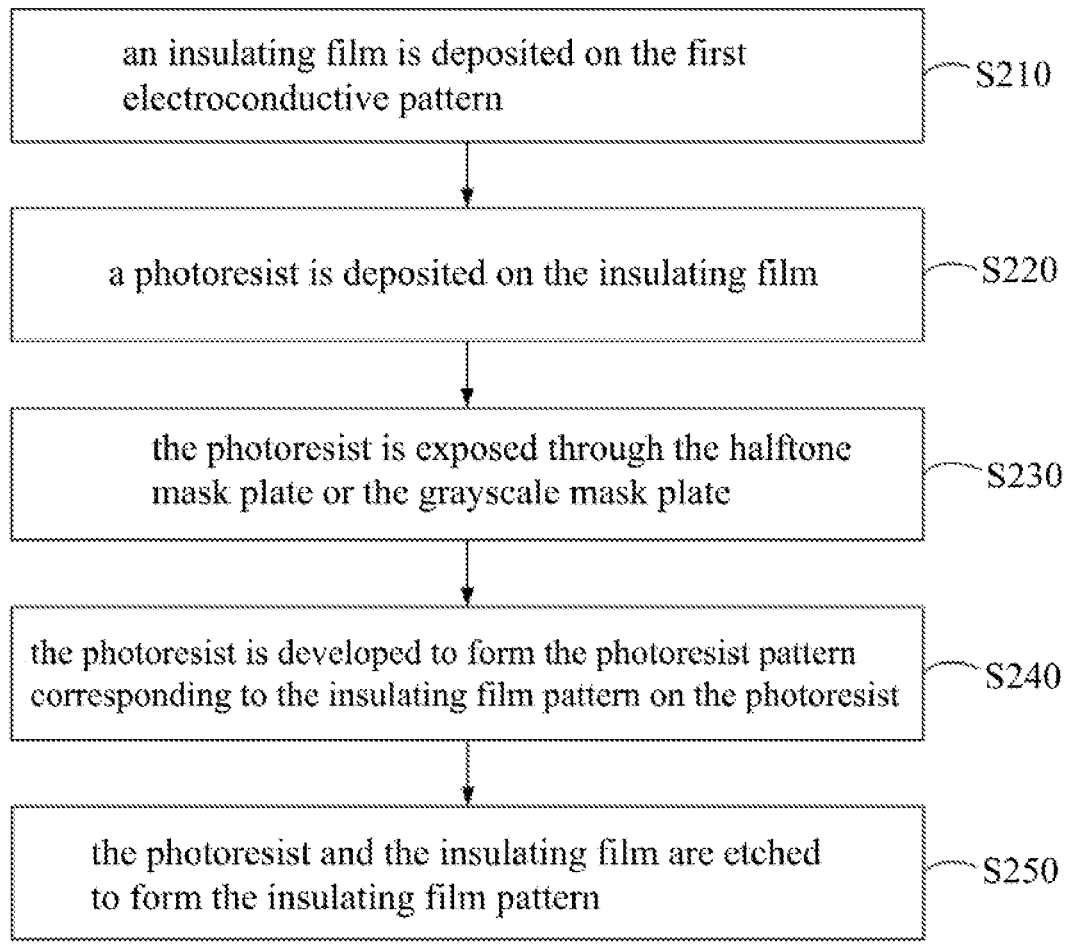
FIG. 7 is a detailed schematic flow chart showing the step S200 in FIG. 6.

In this disclosure, as shown in FIG. 7, the step S200 includes the following steps.

In a step S210, an insulating film is deposited on the first electroconductive pattern.

The deposition of the insulating film may be achieved by processes such as thermal oxidation, sputtering, evaporation, epitaxy and the like, and insulating films of different materials correspond to different depositing processes.

In a step S220, a photoresist is deposited on the insulating film.

The photoresist may be deposited on the insulating film by processes such as spin coating curing process and the like. Before and after the photoresist deposition, the interface may also be correspondingly treated to improve the deposition quality.

In a step S230, the photoresist is exposed through the halftone mask plate or the grayscale mask plate.

The halftone mask plate or the grayscale mask plate is a mask plate with a variety of transmittances, and the photoresist is exposed through the halftone mask plate or the grayscale mask plate. The light source may be an ultraviolet light source, an X-ray light source or the like, and the mask plate pattern is transferred onto the photoresist. Due to the difference in transmittance, the thickness of the exposed photoresist is large in the portion where the transmittance is high, and the thickness of the exposed photoresist is small in the portion where the transmission is low, or even no photoresist is basically exposed.

In a step S240, the photoresist is developed to form the photoresist pattern corresponding to the insulating film pattern on the photoresist.

After the development, the mask plate pattern is transferred into the photoresist pattern, and the photoresist pattern corresponds to the insulating film pattern. The thickness of a portion of the photoresist pattern corresponding to the gate dielectric layer 140 is smaller than the thickness of a portion of the photoresist pattern corresponding to the first insulating layer 400.

In a step S250, the photoresist and the insulating film are etched to form the insulating film pattern.

The photoresist covers the insulating film, and has a certain anti-etching performance. With the progress of the etching process, the photoresist thickness is reduced synchronously. The insulating film is continuously etched in the area where the part of the photoresist is completely removed, and the insulating film is reserved in the area where the part of the photoresist is still present. Finally, the insulating film patterns with different thicknesses are formed to satisfy the performance requirement of the display panel.

Figure 8:
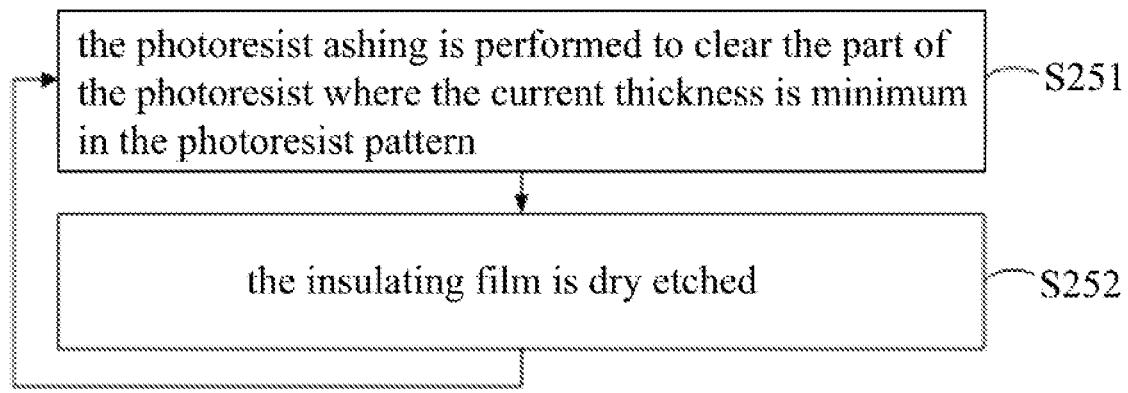
FIG. 8 is a detailed schematic flow chart showing the step S250 in FIG. 7.

Specifically, as shown in FIG. 8, the step S250 includes the following steps.

In a step S251, the photoresist ashing (PR ashing) is performed to clear the part of the photoresist where the current thickness is minimum in the photoresist pattern.

The PR ashing is the process of etching the photoresist. In the above-mentioned process, the photoresist thickness is uniformly thinned, wherein the thinnest part of the photoresist pattern (i.e., the thinnest part corresponding to the insulating film pattern in the finished product) is firstly completely etched away.

In a step S252, the insulating film is dry etched.

After the photoresist on the part of the insulating film is etched and removed, the dry etching method is employed to etch the insulating film to form the insulating film pattern corresponding to the photoresist pattern.

The process returns to the step S251.

After the etching of the above-mentioned part of the insulating film is completed, the process returns to the step S251, the photoresist is ashed to clear the part of the photoresist, where the current thickness is minimum (i.e., the part of the photoresist having the second smallest thickness is cleared), to be formed into the part of the insulating film pattern having the second smallest thickness.

In the process of using the dry etching to form the part of the insulating film pattern having the second smallest thickness, the part of the insulating film having the minimum thickness may also be etched simultaneously. After the current round of etching is completed, corresponding patterns with two different thicknesses will be formed on the insulating film. The above-mentioned steps are repeated to complete the entire insulating film pattern.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A display panel, comprising a plurality of sub-pixels disposed on a substrate of the display panel, each of the sub-pixels comprising:
a drive transistor comprising a gate dielectric layer;
a storage capacitor comprising a capacitance dielectric layer;
a first insulating layer disposed between a data line of the display panel and a scan line of the display panel, wherein the first insulating layer is at least distributed at the intersection of the data line of the display panel and the scan line of the display panel; and
a second insulating layer disposed between the data line and a common line of the display panel, wherein an extending direction of the common line and an extending direction of the scan line are the same;
wherein the gate dielectric layer, the first insulating layer, the capacitance dielectric layer, and the second insulating layer are insulating films integrally formed through a halftone masking or grayscale masking process, and
wherein a thickness of the gate dielectric layer is smaller than a thickness of the first insulating layer, a thickness of the capacitance dielectric layer is smaller than a thickness of the second insulating layer, and the thickness of the first insulating layer is equal to the thickness of the second insulating layer, and
wherein the plurality of sub-pixels are arranged in a rectangular array, one or plural ones of the sub-pixels form a pixel, the sub-pixels in the same pixel are arranged longitudinally;
the plurality of data lines extend longitudinally and are arranged transversally;
the plurality of scan lines extend transversally and are arranged longitudinally; and
the sub-pixels in the same pixel are connected to the same one of the data lines, and are respectively connected to different ones of the scan lines.

2. The display panel according to claim 1, wherein each of the sub-pixels further comprises:
a passivation film, which covers the drive transistor, the data line, the scan line, and the common line, wherein the passivation film comprises a through hole, a sub-pixel electrode is disposed on the passivation film, and the sub-pixel electrode is electrically connected to a drain electrode of the drive transistor through the through hole.

3. The display panel according to claim 1, wherein a material of the insulating film comprises one or plural ones of silicon oxide, silicon nitride, aluminum oxide and hafnium oxide.

4. A method for manufacturing the display panel according to claim 1, comprising the following steps:
a first electroconductive pattern is deposited on the substrate of the display panel, wherein the first electroconductive pattern comprises a gate electrode and the scan line;
an insulating film pattern is deposited on the first electroconductive pattern through the halftone masking or grayscale masking process, wherein the insulating film pattern comprises the gate dielectric layer, the first insulating layer, the capacitance dielectric layer and the second insulating layer; and
a second electroconductive pattern is deposited on the insulating film pattern, wherein the second electroconductive pattern comprises a trench, a source electrode, a drain electrode, and the data line.

5. The method according to claim 4, wherein the first electroconductive pattern further comprises a second electrode and the common line;
a pattern of a passivation film is deposited on the second electroconductive pattern, wherein the passivation film comprises a through hole; and
a third electroconductive pattern is deposited on the pattern of the passivation film, wherein the third electroconductive pattern comprises a first electrode and a sub-pixel electrode, and the sub-pixel electrode is electrically connected to the drain electrode through the through hole.

6. The method according to claim 4, wherein the step of the insulating film pattern deposited on the first electroconductive pattern through the halftone masking or the grayscale masking process comprises:
- an insulating film is deposited on the first electroconductive pattern;
- a photoresist is deposited on the insulating film;
- the photoresist is exposed through a halftone mask plate or a grayscale mask plate;
- the photoresist is developed to form a photoresist pattern corresponding to the insulating film pattern on the photoresist, wherein a thickness of a portion of the photoresist pattern corresponding to the gate dielectric layer is smaller than a thickness of a portion of the photoresist pattern corresponding to the first insulating layer; and
- the photoresist and the insulating film are etched to form the insulating film pattern.

7. The method according to claim 6, wherein the step of the photoresist and the insulating film etched to form the insulating film pattern comprises:
- a photoresist ashing is performed to clear the part of the photoresist where the current thickness is minimum in the photoresist pattern;
- the insulating film is dry etched; and
- returning to the step that the photoresist ashing is performed to clear the part of the photoresist where the current thickness is minimum in the photoresist pattern.

8. The method according to claim 6, wherein a material of the insulating film comprises one or plural ones of silicon oxide, silicon nitride, aluminum oxide and hafnium oxide.

9. A display panel, comprising a plurality of sub-pixels disposed on a substrate of the display panel, each of the sub-pixels comprising:
- a drive transistor comprising a trench, a source electrode, a drain electrode, a gate dielectric layer, and a gate electrode, wherein the source electrode and the drain electrode are respectively connected to two ends of the trench, and the gate dielectric layer is disposed among the trench, the source electrode, the drain electrode and the gate electrode;
- a data line electrically connected to the source electrode;
- a scan line electrically connected to the gate electrode;
- a sub-pixel electrode electrically connected to the drain electrode;
- a common line, wherein the extending directions of the common line and the scan line are the same, and the common line is insulated from the scan line;
- a storage capacitor comprising a first electrode, a second electrode, and a capacitance dielectric layer, wherein the first electrode is electrically connected to the sub-pixel electrode, the second electrode is electrically connected to the common line, and the capacitance dielectric layer is disposed between the first electrode and the second electrode;
- a first insulating layer disposed between the data line and the scan line, wherein the first insulating layer is at least distributed at the intersection of the data line of the display panel and the scan line of the display panel; and
- a second insulating layer disposed between the data line and the common line, wherein an extending direction of the common line and an extending direction of the scan line are the same;
- wherein the gate dielectric layer, the first insulating layer, the capacitance dielectric layer and the second insulating layer are insulating films integrally formed through a halftone masking or grayscale masking process, and
- wherein a thickness of the gate dielectric layer is smaller than a thickness of the first insulating layer, a thickness of the capacitance dielectric layer is smaller than a thickness of the second insulating layer, and the thickness of the first insulating layer is equal to the thickness of the second insulating layer, and
- wherein the plurality of sub-pixels are arranged in a rectangular array, one or plural ones of the sub-pixels form a pixel, the sub-pixels in the same pixel are arranged longitudinally;
- the plurality of data lines extend longitudinally and are arranged transversally;
- the plurality of scan lines extend transversally and are arranged longitudinally; and
- the sub-pixels in the same pixel are connected to the same one of the data lines, and are respectively connected to different ones of the scan lines.

10. The display panel according to claim 9, wherein each of the sub-pixels further comprises:
- a passivation film, which covers the drive transistor, the data line, the scan line, and the common line, wherein the passivation film comprises a through hole, a sub-pixel electrode is disposed on the passivation film, and the sub-pixel electrode is electrically connected to the drain electrode of the drive transistor through the through hole.

11. The display panel according to claim 9, wherein a material of the insulating film comprises one or plural ones of silicon oxide, silicon nitride, aluminum oxide and hafnium oxide.

* * * * *